(12) United States Patent
Darbha et al.

(10) Patent No.: US 10,048,306 B1
(45) Date of Patent: Aug. 14, 2018

(54) METHODS AND APPARATUS FOR AUTOMATED INTEGRATED CIRCUIT PACKAGE TESTING

(71) Applicant: Altera Corporation, San Jose, CA (US)

(72) Inventors: Srikanth Darbha, San Jose, CA (US); Ronald M. Beach, Pleasanton, CA (US); Vadali Mahadev, San Jose, CA (US); Ganesh Sure, Cupertino, CA (US); Kaushik Chanda, San Jose, CA (US)

(73) Assignee: Altera Corporation, San Jose, CA (US)

( * ) Notice: Subject to any disclaimer, the term of this patent is extended or adjusted under 35 U.S.C. 154(b) by 546 days.

(21) Appl. No.: 14/635,570

(22) Filed: Mar. 2, 2015

(51) Int. Cl.
*G01R 31/02* (2006.01)
*G01R 31/28* (2006.01)
*G01R 1/04* (2006.01)

(52) U.S. Cl.
CPC ......... *G01R 31/025* (2013.01); *G01R 1/0433* (2013.01); *G01R 31/026* (2013.01); *G01R 31/2889* (2013.01)

(58) Field of Classification Search
CPC .. G01R 31/025; G01R 31/024; G01R 31/026; G01R 1/0433
See application file for complete search history.

(56) References Cited

U.S. PATENT DOCUMENTS

| | | | |
|---|---|---|---|
| 5,475,317 A | 12/1995 | Smith | |
| 6,313,647 B1 * | 11/2001 | Feng | G01R 27/02 324/602 |
| 6,380,729 B1 * | 4/2002 | Smith | G01R 31/2884 257/209 |
| 6,564,986 B1 * | 5/2003 | Hsieh | G01R 31/2812 174/260 |
| 7,307,442 B2 | 12/2007 | Ong | |
| 7,310,000 B2 | 12/2007 | Ong | |
| 7,446,551 B1 | 11/2008 | Ong | |
| 7,509,543 B2 | 3/2009 | Mohr | |
| 7,941,712 B2 | 5/2011 | Mohr et al. | |
| 2005/0088195 A1 * | 4/2005 | Grilletto | G01R 31/2879 324/754.02 |

(Continued)

*Primary Examiner* — Huy Q Phan
*Assistant Examiner* — Dustin Dickinson
(74) *Attorney, Agent, or Firm* — Treyz Law Group, P.C.; Jason Tsai

(57) ABSTRACT

A test system for testing an integrated circuit package is provided. The test system may include a test board on which a package under test can be mounted, a test box for gathering desired measurements on the package under test, and a test host for automatically controlling the test box during testing. The test box may be coupled to row multiplexing circuitry and column multiplexing circuitry for selectively addressing one or more daisy-chained nets in the package under test. The test box may also be coupled to a source measurement unit (SMU) component that provides current source signals to the package under test and to a digital multimeter (DMM) component that provides voltage sense signals to the package under test. Arranged in this way, the test system can be configured to perform automated I-V curve tracing, resistance measurements, open/short circuit detection, and monitoring of other package-level manufacturing defects.

9 Claims, 7 Drawing Sheets

(56) References Cited

U.S. PATENT DOCUMENTS

| | | | |
|---|---|---|---|
| 2007/0080704 A1* | 4/2007 | Park | G01R 31/2853 324/762.02 |
| 2011/0204914 A1* | 8/2011 | Roberts | G01R 31/2889 324/756.02 |
| 2014/0091819 A1* | 4/2014 | Gong | G01R 31/31926 324/750.3 |
| 2014/0247064 A1* | 9/2014 | Rabe | G01R 31/2843 324/750.01 |

* cited by examiner

METHODS AND APPARATUS FOR AUTOMATED INTEGRATED CIRCUIT PACKAGE TESTING

BACKGROUND

This relates to integrated circuits, and more particularly, to testing integrated circuit packages.

An integrated circuit package typically includes a package substrate, an integrated circuit die mounted on the package substrate, and some type of package housing material formed over the integrated circuit die on the package substrate to seal the integrated circuit die within the integrated circuit package. An array of solder balls (commonly referred to as a ball grid array or BGA) is often formed at the bottom of the package substrate for use in facilitating input-output communications with external components.

Consider a scenario in which a first solder ball in the ball grid array is electrically connected to a second solder ball in the ball grid array via an intra-package path passing through one or more integrated circuit die within a single package. The first and second solder balls and the intra-package path coupling the first solder ball to the second solder ball can sometimes be referred to collectively as a BGA daisy-chain net pair.

It is generally desirable to be able to test the integrated circuit package to ensure that all the solder balls in the ball grid array are properly manufactured (i.e., properly connected to the integrated circuit die without any inadvertent short or open circuits). Conventional test systems, however, do not offer a simple automated way for performing I-V (current-voltage) curve tracing and for making electrical measurements for detecting opens/shorts across any desired BGA daisy-chain net pair. Existing package test systems for isolating manufacturing faults are extremely time-consuming, especially for packages with higher than average pin counts. Moreover, current test systems cannot be adapted to test packages with different pin counts, and as a result, separate test board designs are required for testing different types of packages.

SUMMARY

A test system for detecting manufacturing defects on an integrated circuit package under test is provided. The test system may include a test board, a socket on the test board that includes an array of test contacts (e.g., conductive pads or other test structures configured to mate with the integrated circuit package), row multiplexing circuitry coupled to respective rows in the array of test contacts, and column multiplexing circuitry coupled to respective columns in the array of test contacts. An automated test platform running on a test host (e.g., a personal computer) may be used to configure the row and column multiplexing circuitries to select a subset of test contacts in the array for testing.

The column multiplexing circuitry may be coupled to only a subset of columns in the array (e.g., the column multiplexing circuit may be coupled to every other column of test contacts in the array). The row multiplexing circuitry may be coupled to only a subset of test contacts in each row of the array (e.g., the row multiplexing circuitry may be coupled to test contacts in every other column of the array).

In particular, a daisy chain in the IC package may be selected for testing. The test system may also include a data acquisition system having a source measurement unit that supplies and receives test current source signals to and from the selected daisy chain and a voltage metering unit that supplies and receives test voltage sense signals to and from the selected daisy chain. Configured in this way, the test system is capable of computing resistance values based on the gathered test data, monitoring for the presence of short circuit and open circuit faults at the daisy chain based on the computed resistance values, performing I-V curve tracing, and detecting any other type of package-level manufacturing defects by comparing the test data to baseline reference data in an automated manner.

Further features of the invention, its nature and various advantages, will be more apparent from the accompanying drawings and the following detailed description of the preferred embodiments.

DETAILED DESCRIPTION

Embodiments of the present invention relate to integrated circuits, and more particularly, to testing integrated circuit packages.

During semiconductor manufacturing, a semiconductor wafer on which integrated circuit structures are formed can be diced into multiple individual integrated circuit (IC) dies. One or more integrated circuit dies can then be packaged within a single integrated circuit housing structure often referred to as an integrated circuit package. The integrated circuit package may include solder balls/bumps, conductive leads, metal pads, or other contact members for interfacing with external circuitry.

As an example, a ball grid array (BGA) package may include an array of solder balls formed at its bottom surface. These solder balls may be electrically coupled to one or more circuits on the integrated circuit die within that BGA package. In general, it may be desirable to perform tests to determine whether the BGA solder balls are properly connected to the circuits within the integrated circuit die. In some scenarios, one or more BGA solder balls can be inadvertently shorted to a neighboring solder ball (i.e., resulting in an unintentional short circuit fault). In other scenarios, a connection between a given BGA solder ball and a corresponding circuit in the integrated circuit die may be inadvertently broken (i.e., resulting in an unintentional open circuit fault). In yet other possible scenarios, the resistance at one or more BGA solder balls may deviate from the desired level by more than an acceptable amount due to other processing/manufacturing defects.

Conventional test systems are not flexible enough to be able to perform I-V curve tracing, resistance measurement, open/short circuit detection, and other failure detection on an arbitrary pair of BGA solder balls in the array in an automated fashion. As a result, conventional IC package testers are extremely time consuming to operate and need to be redesigned for packages with different pinout configurations. It would therefore be desirable to provide improved integrated circuit package test systems that are capable of detecting different types of manufacturing faults in an automated fashion.

Figure 1:
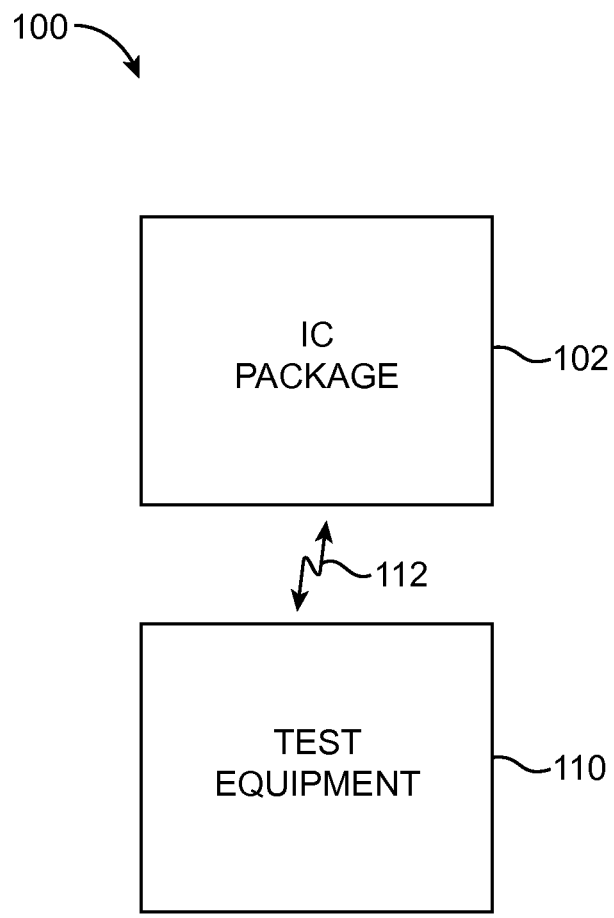
FIG. 1 is a diagram showing illustrative test equipment that can be used to test and debug an integrated circuit package in accordance with an embodiment.

FIG. 1 is a diagram of an illustrative test system 100 in accordance with an embodiment of the present invention. Test system 100 may include test equipment 110 for testing and/or debugging an integrated circuit (IC) package such as package 102. In general, IC package 102 may include one or more integrated circuit dies which may include (but are not limited to) programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Test equipment 110 may communicate with package 102 via path 112. In particular, one or more input-output (IO) pins (e.g., bonded-out external package pins) that are part of package 102 may be used to interface directly with test equipment 110 during test and debug operations. The IO package pins may, for example, be implemented using solder balls, solder bumps, conductive leads, conductive pads, and/or other types of discrete package mounting members.

Figure 2:
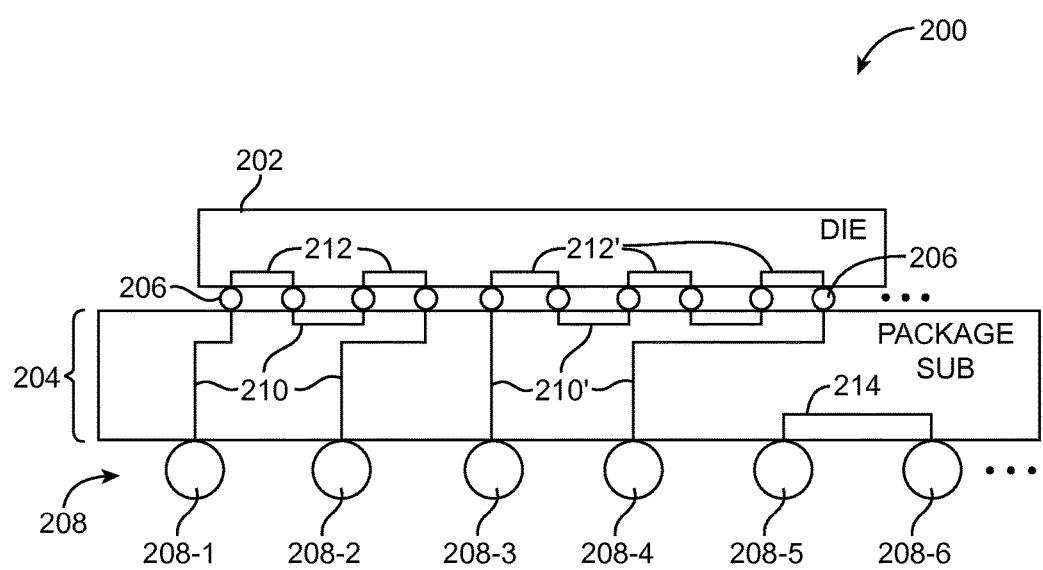
FIG. 2 is a cross-sectional side view of an illustrative ball grid array (BGA) package having multiple daisy-chained BGA ball pairs in accordance with an embodiment.

FIG. 2 is a cross-sectional side view of one suitable arrangement of an IC package 102. As shown in FIG. 2, an integrated circuit die 202 may be mounted on a package substrate such as package substrate 204 via conductive bumps 206. Bumps 206 that interface directly with package substrate 204 may sometimes be referred to as controlled collapse chip connection (C4) bumps or flip-chip bumps and may each have a diameter of 100 µm (as an example). An array of solder balls 208 (sometimes referred to collectively as a ball grid array or BGA) may be formed at the bottom surface of package substrate 204. Generally, BGA solder balls 208 are larger in size relative to the flip-chip bumps 206.

In the example of FIG. 2, at least some of the BGA solder balls are interconnected via a series of intra-package signal paths sometimes referred to herein as "daisy chains." As an example, solder ball 208-1 may be coupled to solder ball 208-2 via a first daisy chain that includes a first set of package substrate interconnect paths 210 and on-die interconnect paths 212. Package substrate interconnect paths 210 may include conductive package traces and via structures for connecting a BGA solder ball 208 to a flip-chip bump 206 or for connecting one flip-chip bump 206 to another. On-die interconnect paths 212 may include metal routing paths and via structures formed within a dielectric stack in die 202 (e.g., an interconnect stack formed from alternating metal routing layers and via layers) and may serve to connect one flip-chip bump 206 to another, to connect transistor structures on die 202 to one or more flip-chip bumps 206, or for providing desired signal routing paths within die 202. The first daisy chain may (in this example) traverse four flip-chip bumps 206. BGA balls 208-1 and 208-2 connected at the ends of the first daisy chain may sometimes be referred to herein as a BGA daisy chain net pair or a daisy-chained BGA ball pair.

As another example, solder ball 208-3 may be coupled to solder ball 208-4 via a second daisy chain that includes a second set of package substrate interconnect paths 210' and on-die interconnect paths 212'. The second daisy chain may (in this example) traverse six flip-chip bumps 206. As yet another example, solder ball 208-5 may be coupled to solder ball 208-6 via a third daisy chain that includes only a package substrate interconnect path 214 (e.g., the third daisy chain does not traverse any C4 bumps 206). In the particular example of FIG. 2, the third daisy chain is the shortest daisy chain out of the three daisy chains and may therefore exhibit the smallest path resistance. On the other hand, the second daisy chain is the longest daisy chain out of the three daisy chains and may therefore exhibit the largest path resistance.

The arrangement of FIG. 2 is merely illustrative and does not serve to limit the scope of the present invention. If desired, less than three daisy chains or more than three daisy chains may be formed within package 200. Other suitable arrangements may include two or more integrated circuit dies mounted on a common intermediate substrate such as an interposer structure or interconnect bridging structure, two or more integrated circuit dies stacked on top of one another, wire-bonded packages, lead frame packages, and other suitable types of IC packages.

Figure 3:
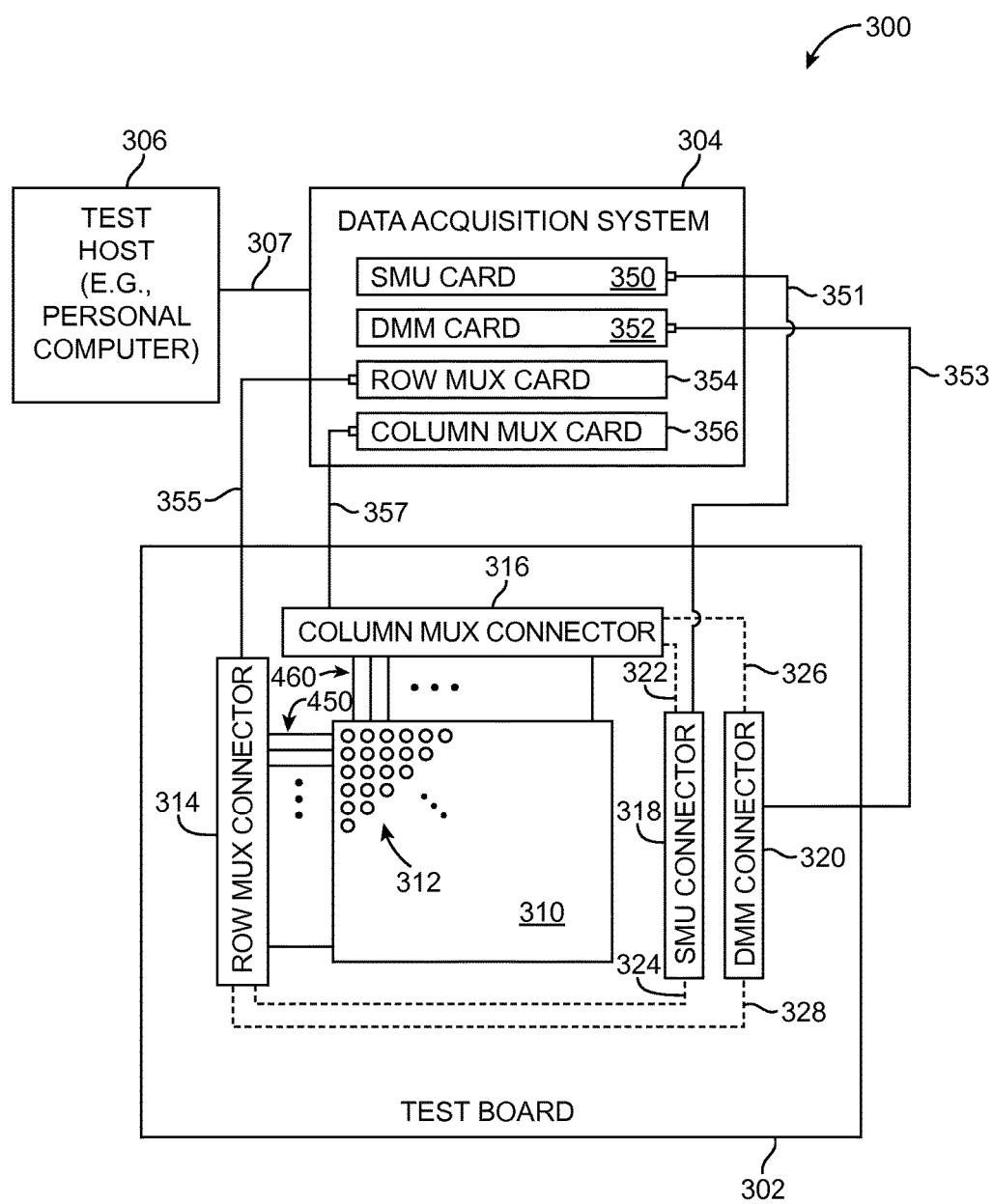
FIG. 3 is a diagram of an illustrative test system that can be configured to perform automated failure debug on a BGA package in accordance with an embodiment.

As described above, it may be desirable to provide a test system that is capable of carrying out automated manufacturing defect detection for an arbitrary IC package. FIG. 3 is a diagram of an illustrative test system 300 that utilizes a reconfigurable cross-point switch matrix implemented using row and column multiplexing circuitry in accordance with an embodiment. As shown in FIG. 3, test system 300 may include a test board 302, a data acquisition system 304, and a test host 306. Test host 306 may, for example, be a personal computer on which test software such as LabVIEW or other system-design platform that can be used for data acquisition, instrument control, and test automation can be run.

Test host 306 may send commands to data acquisition system (sometimes abbreviated as DAQ) 304 via control path 307. If desired, measurement data gathered using data acquisition system 304 may be fed back to the test host 306 via control path 307. Data acquisition system 304 may, for example, be the PXI Express 1062Q measurement chassis available from National Instruments. Data acquisition system 304 (sometimes referred to as a test unit or test box) may be used to gather desired measurement information from an integrated circuit packaged attached to the test board 302.

Test unit 304 may have multiple slots in which various test equipment control cards can be inserted. As shown in FIG. 3, a source measurement unit (SMU) card 350 may be inserted in a first slot; a digital multimeter (DMM) card 352 may be inserted in a second slot; a row multiplexer card 354 may be inserted in a third slot; and a column multiplexer card 356 may be inserted in a fourth slot. The SMU card 350 may be coupled to the test board 302 via a corresponding SMU connector 318 and associated cable 351. The DMM card 352 may be coupled to the test board 302 via a corresponding DMM connector 320 and associated cable 353. The row multiplexer (or "mux") card 354 may be coupled to test board 302 via a corresponding row mux connector 314 and associated cable 355. The column multiplexer card 356 may be coupled to test board 302 via a corresponding column mux connector 316 and associated cable 357.

The row and column multiplexing circuitry may be coupled to a socket 310 on the test board 302. Socket 310 may be configured to receive an integrated circuit package that is to be tested. The integrated circuit package that is being tested by test system 300 is sometimes referred to herein as a "device under test" or a DUT. Socket 310 may include one or more test contact members 312 which are configured to mate with corresponding IO connectors on the package under test. Embodiments in which contact members 312 are arranged in an array configuration are sometimes described herein.

The row multiplexing circuitry may be coupled to respective rows of test contact members 312 via row control lines 450 (e.g., each row line 450 may be coupled to at least some test contacts arranged along a corresponding row in the array of test contacts), whereas the column multiplexing circuitry may be coupled to respective columns of test contact members 312 via column control lines 460 (e.g., each column line 460 may be coupled to at least some test contacts arranged along a corresponding column in the array of test contacts).

In accordance with another embodiment, the SMU components may be coupled to the column mux connector 316 via path 322 and to the row mux connector 314 via path 324 to supply a test current source to the DUT during testing. On the other hand, the DMM components may be coupled to the column mux connector 316 via path 326 and to the row mux connector 314 via path 328 to provide voltage sensing capabilities for the DUT during testing. These paths (e.g., paths 322, 324, 326, and 328) may be implemented as traces on test board 302, as discrete/integrated cables, or other types of conductive paths.

Figure 4:
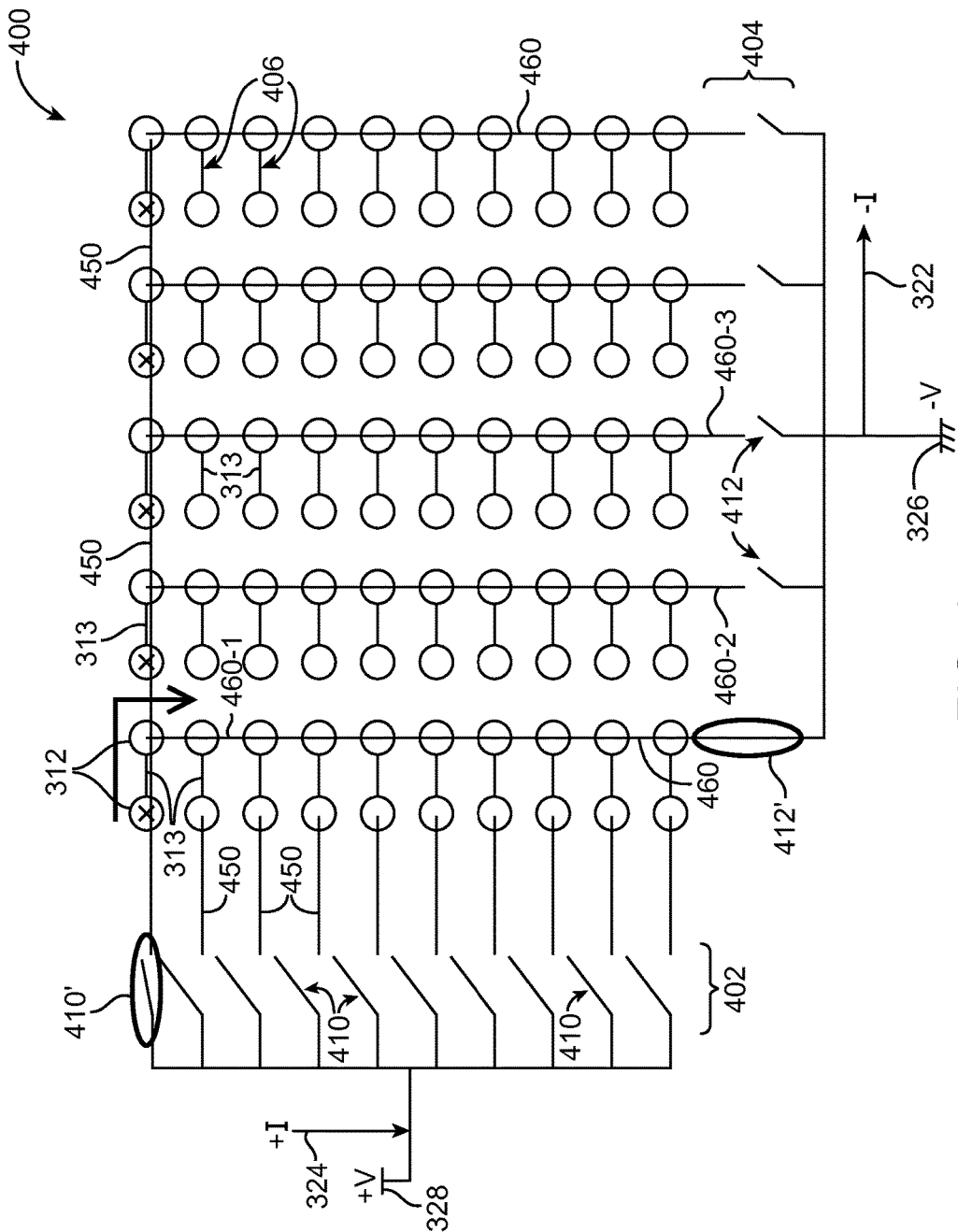
FIG. 4 is diagram of an illustrative cross-point switch matrix on a printed circuit test board for enabling automated measurement of current, voltage, and resistance and detection of open and short circuits between two solder balls in any user-selected daisy-chained BGA ball pair in the ball grid array in accordance with an embodiment.

In particular, the row and column multiplexing circuitry may be configured to implement a cross-point switch matrix of the type shown in FIG. 4. As shown in FIG. 4, an array 400 of test contact members 312 may be formed within the DUT socket region of the test board. Array 400 may serve as a plurality of conductive pads for mating with a corresponding ball grid array of an IC package under test (as an example). Each line 313 in FIG. 4 linking a respective pair of BGA test pads may represent a corresponding daisy chain within the package under test. Therefore, in the example of FIG. 4, the test contact members 312 may be grouped into daisy-chained net pairs.

Each row line 450 may be coupled to only a first of the two test contact members 312 within each daisy-chained net pair. For example, row lines 450 may be coupled to the test contact member in every odd column while skipping the even columns (as indicated by the "X" mark along line 450 in the first row). The row lines 450 in the other remaining rows may also be routed in this similar fashion but the detailed wiring is not shown in FIG. 4 for clarity.

Each column line 460 may be coupled to only a second of the two test contact members 312 within each daisy-chained net pair. For example, a first column line 460-1 may be coupled to every test contact member arranged along a second column in array 400; a second column line 460-2 may be coupled to every test contact member arranged along a fourth column in array 400; and a third column line 460-3 may be coupled to every test contact member arranged along a sixth column in array 400; and so on. In other words, column lines 460 may be coupled to the test contact member in every even column while skipping the odd columns.

Still referring to FIG. 4, row multiplexing circuitry 402 may be coupled to the row lines 450, whereas the column multiplexing circuitry 404 may be coupled to the column lines 460. Row multiplexing circuitry 402 may include a plurality of switches 410 (e.g., switches included within row mux card 354 of FIG. 3), a selected one of which can be activated to pass a first current source signal +I provided from the SMU via path 324 and a first voltage sense signal +V provided from the DMM via path 328 to the test contact members arranged along the selected row. Similarly, column multiplexing circuitry 404 may include a plurality of switches 412 (e.g., switches included within column mux card 356 of FIG. 3), a selected one of which can be activated to pass a second current source signal −I from one of the test contact members in the selected column back to the SMU card via path 322 and a second voltage sense signal −V from one of the test contact members in the selected column back to the DMM card via path 326.

In the example of FIG. 4, row switch 410' in the first row is turned on and column switch 412' in the first column is turned on so that test signals can pass from the test equipment through the first daisy-chained net pair in the package under test and back to the test equipment. Test data for another BGA pair can be easily measured by simply turning on another switch in the row mux or the column mux circuit. In other words, any arbitrary group of daisy-chained nets can be selected for testing by individually addressing the row line and the column line that intersect with the desired daisy-chained net to be tested. This way of addressing a particular region for testing is sometimes referred to herein as a cross-point switch matrix selection scheme. By gathering test data using software-controlled multiplexing circuitry in this way (e.g., by measuring the first and second test current source signals +/−I and by measuring the first and second test voltage sense signals +/−V), the test system is able to perform I-V curve tracing, electrical resistance measurement, open/short circuit determination, and other manufacturing fault detection across any user-selected daisy-chained net pair in the package under test in an automated fashion.

Figure 5A:
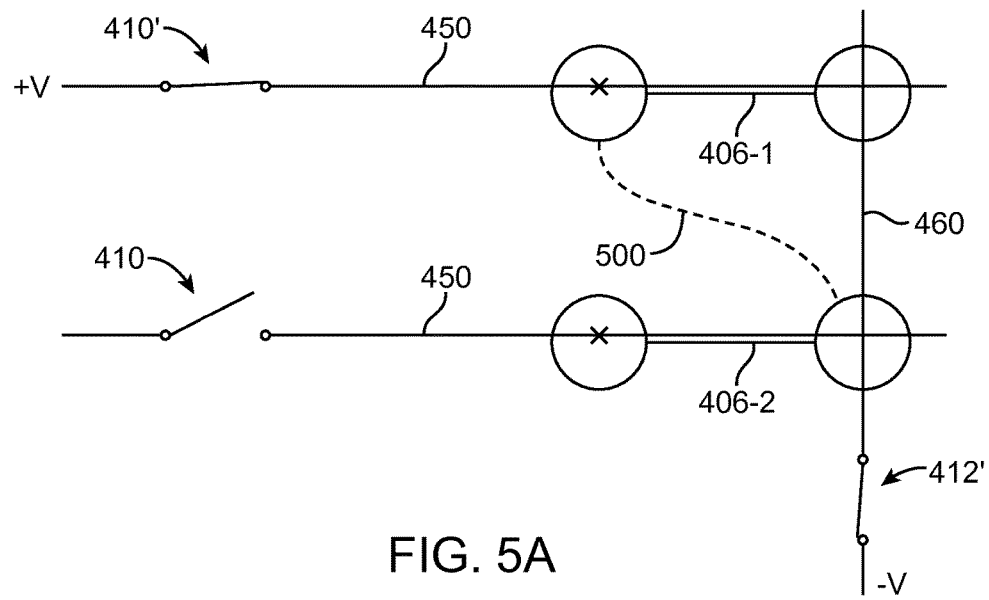
FIGS. 5A and 5B are diagrams illustrating potential short circuit failure scenarios in accordance with some embodiments.
Figure 5B:
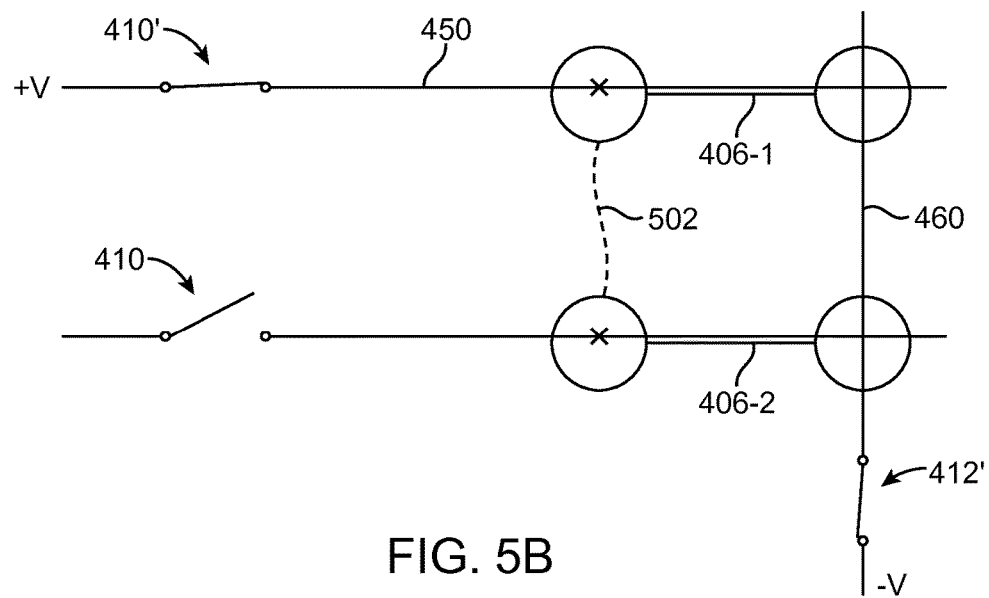

FIGS. 5A and 5B are diagrams illustrating potential short circuit failure scenarios in accordance with some embodiments. FIGS. 5A and 5B show a first daisy chain net pair (e.g., a first pair of test pads between which first intra-package daisy chain 406-1 is connected) and a second daisy chain net pair (e.g., a second pair of test pads between which second intra-package daisy chain 406-2 is connected) being coupled to test equipment of the type described in connection with at least FIGS. 3 and 4. In particular, switches 410' and 412' have been closed to test the first daisy chain.

In a first possible scenario, an undesirable shorting path 500 may be formed from the first test contact in the first BGA pair to the second test contact in the second BGA pair (see, e.g., FIG. 5A). Arranged in this way, the first daisy chain is completely shorted out by fault path 500 and detection of such faults can be identified by monitoring for unexpectedly low resistance values (as an example).

In a second possible scenario, an undesirable shorting path 502 may be formed from the first test contact in the first BGA pair to the first test contact in the second BGA pair (see, e.g., FIG. 5B). Arranged in this way, the first daisy chain and the second daisy chain are effectively coupled in parallel, thereby resulting in a reduction in resistance. Similar to the scenario of FIG. 5A, detection of such faults can be identified by monitoring for resistance values measured below a predetermined threshold (as an example).

Figure 6A:
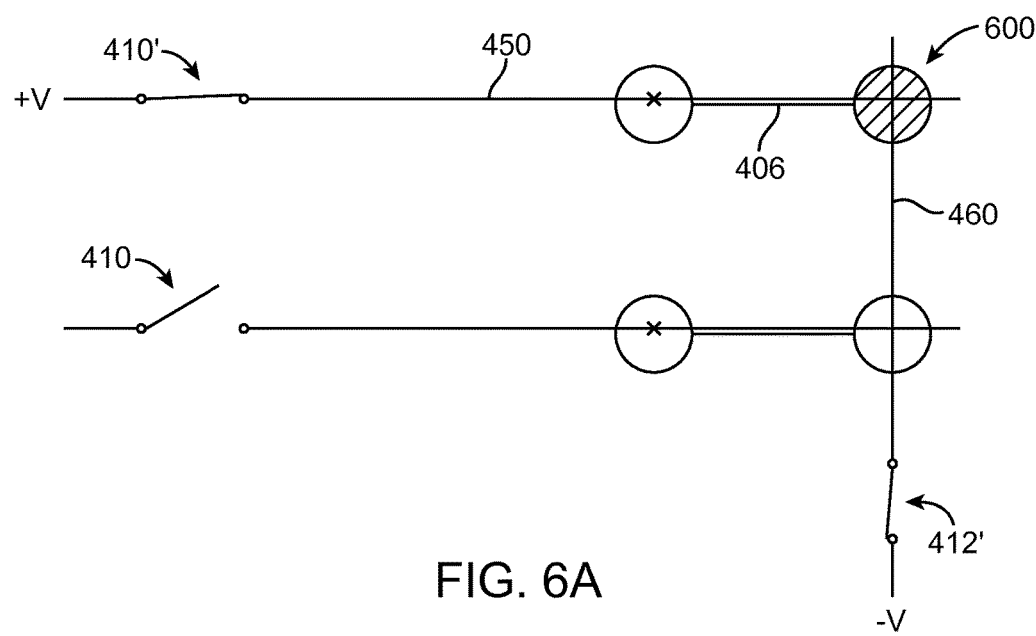
FIGS. 6A and 6B are diagrams illustrating potential open circuit failure scenarios in accordance with some embodiments.
Figure 6B:
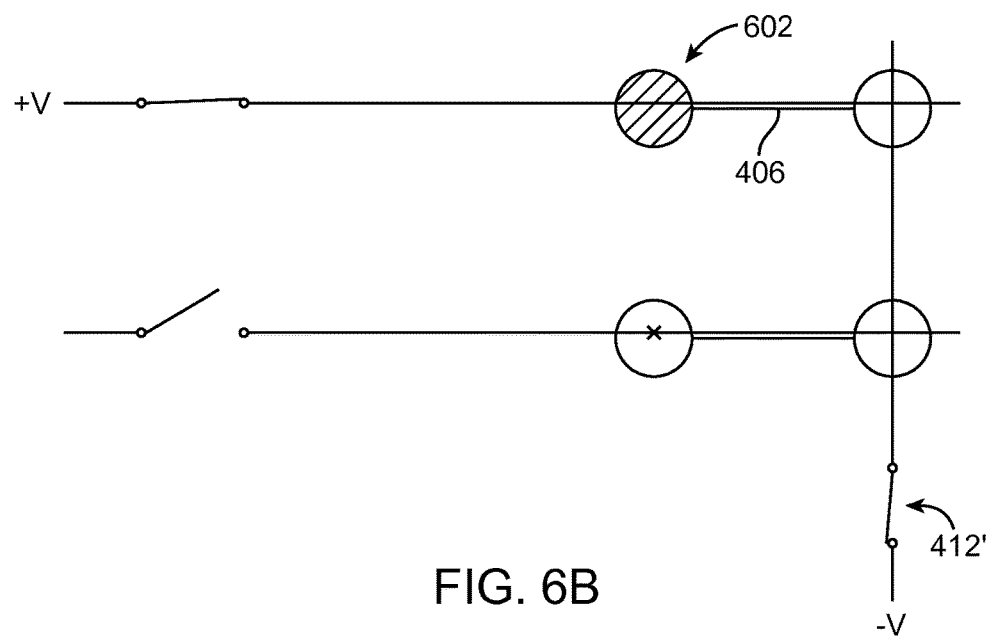

FIGS. 6A and 6B are diagrams illustrating potential open circuit failure scenarios in accordance with other suitable embodiments. As shown in FIGS. 6A and 6B, switches 410' and 412' have been turned on to test the first daisy chain 406.

In a first possible scenario, a faulty test contact 600 (as indicated by the shaded solder ball region in FIG. 6A) may be inadvertently decoupled from daisy chain 406 due to manufacturing defects. Due to this open circuit configuration, unexpectedly high resistance values can be detected, which are indicative of undesired short circuit faults.

In a second possible scenario, a faulty test contact 602 (as indicated by the shaded solder ball region in FIG. 6B) may be inadvertently decoupled from daisy chain 406 due to manufacturing defects. Due to this open circuit configuration, resistance values that exceed some predetermined threshold can also be observed, which are indicative of undesired short circuit faults.

The examples of FIGS. 5 and 6 in which open and short circuit manufacturing faults can be detected using the aforementioned cross-point switch matrix addressing scheme is merely illustrative and do not intend to limit the scope of the present invention. In general, other sorts of package manufacturing defects that can possibly cause malfunction of the IC package during normal operation can also be tested for using the test system of at least FIGS. 3 and 4.

Figure 7:
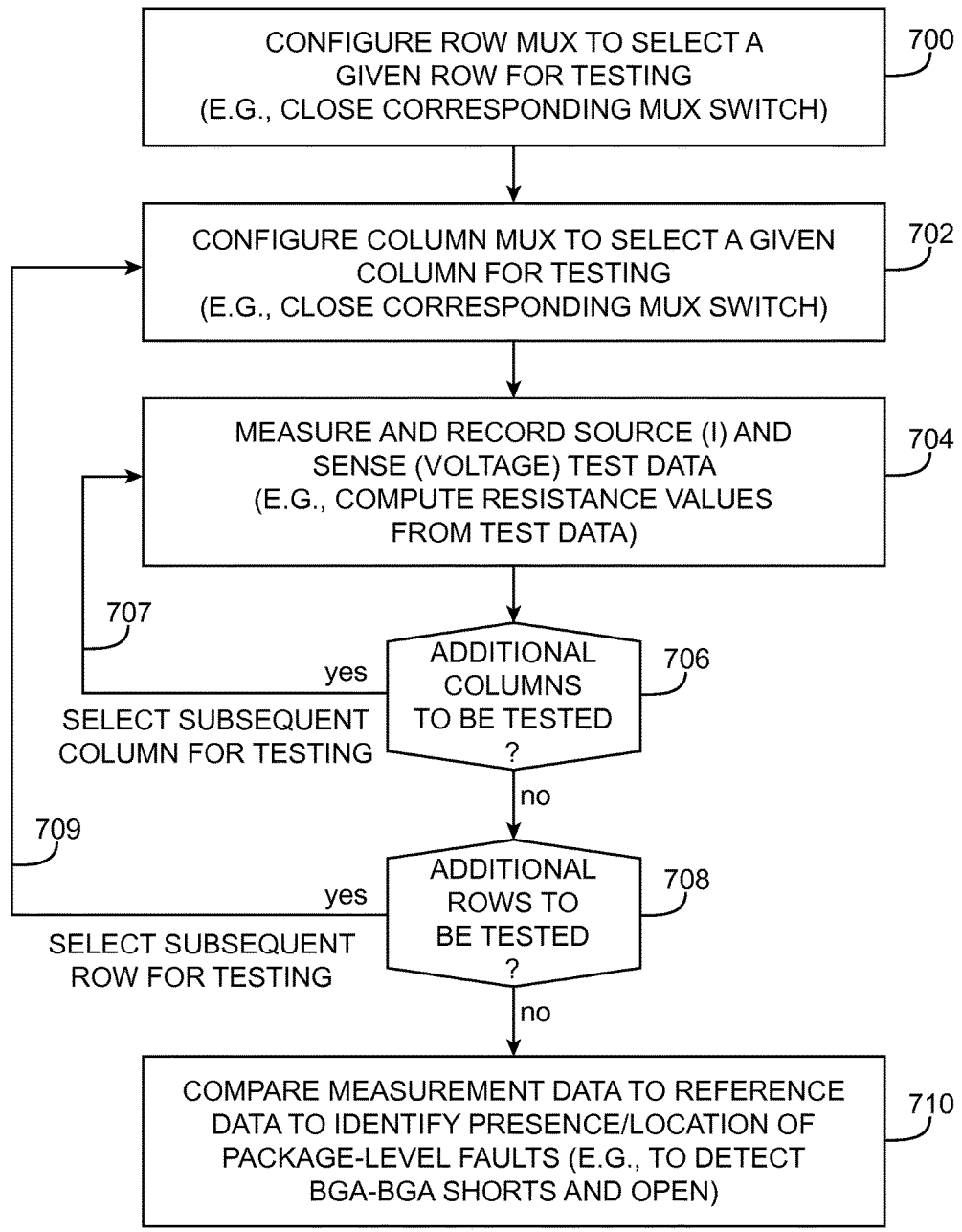
FIG. 7 is a flow chart of illustrative steps for operating an integrated package test system of the type shown in connection with FIGS. 3 and 4 in accordance with an embodiment.

FIG. 7 is a flow chart of illustrative steps for operating an integrated package test system of the type shown in connection with FIGS. 3 and 4. At step 700, a test automation platform running on the test host may send commands to the test unit (i.e., the data acquisition system) to configure the row multiplexing circuitry to select a given row for testing (e.g., by closing a corresponding multiplexer switch in the selected row).

At step 702, the test automation platform may send comments to the test unit to configure the column multiplexing circuitry to select a given column for testing (e.g., by turning on a corresponding multiplexer switch in the selected column). Addressed in this way, the IC package contacts corresponding to the cross-point intersection of the selected row and column may be selected for testing.

At step 704, the test unit may then be used to measure and record source (+/−I) and sense (+/−V) test data from the selected portion of the DUT. For example, current and voltage input signals can be swept and corresponding current and voltage output signals can be measured to capture an I-V curve. If desired, electrical resistance values can be computed across different operating points.

At step 706, the test unit may determine whether there are additional columns to be tested. If there are remaining untested columns, processing may loop back to step 704 to select a subsequent column for testing (as indicated by path 707).

At step 708, the test unit may determine whether there are additional rows to be tested. If there are remaining untested rows, processing may loop back to step 702 to select a subsequent row for testing (as indicated by path 709).

When the entire DUT has been tested, the measured data can be compared with reference data to identify the presence and/or location of any desired package-level faults (e.g., to detect BGA-BGA short circuits, BGA-BGA open circuits, other types of faulty connections, and/or other package manufacturing defects). A test system operated in this way can be scaled to automatically test IC packages of any size by simply reconfiguring the row and column multiplexing circuit to perform the desired cross-point selection during testing. This type of addressing scheme also allows for finer debug of failing daisy chain nets (e.g., the precise location of the defective net can be readily identified).

The embodiments described here where a single-chip BGA package is being tested is merely illustrative and do not serve to limit the scope of the present invention. If desired, the illustrative test system can be used to test multichip packages (e.g., packages with two or more integrated circuit dies, three or more integrated circuit dies, laterally mounted dies on an interposer, dies stacked on top of one another, etc.), dual in-line (DIP) packages, lead frame packages, quad-flat no-leads (QFN) packages, and/or other types of surface mount packages.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. A test system for testing an integrated circuit package, comprising:
   a test board;
   a socket on the test board that includes an array of test contacts configured to mate with the integrated circuit package;
   row multiplexing circuitry coupled to respective rows in the array of test contacts; and
   column multiplexing circuitry coupled to respective columns in the array of test contacts, wherein the row and column multiplexing circuitries are configured to select first and second test contacts in the array for testing, wherein a daisy chain on the integrated circuit package is coupled between the first and second test contacts, wherein the row multiplexing circuitry is coupled to the first test contact, and wherein the column multiplexing circuitry is coupled to the second test contact.

2. The test system defined in claim 1, further comprising:
   a source measurement unit that supplies test current source signals to the first and second test contacts during testing.

3. The test system defined in claim 1, further comprising:
   a digital multimeter unit that supplies test voltage sense signals to the first and second test contacts during testing.

4. The test system defined in claim 1, wherein the column multiplexing circuitry is coupled to only a subset of columns in the array.

5. The test system defined in claim 4, wherein the column multiplexing circuitry is coupled to every other column of test contacts in the array.

6. The test system defined in claim 1, wherein the row multiplexing circuitry is coupled to only a subset of test contacts in each row of the array.

7. The test system defined in claim 6, wherein the row multiplexing circuitry is coupled to test contacts in every other column of the array.

8. The test system defined in claim 1, further comprising:
   a test host that runs an automated test platform for controlling the row and column multiplexing circuitries during testing.

9. The test system defined in claim 1, wherein the row multiplexing circuitry is part of a row multiplexing card that is mounted on a data acquisition system, wherein the column multiplexing circuitry is part of a column multiplexing card that is mounted on the data acquisition system, and wherein the data acquisition system further comprises:
- a source measurement unit (SMU) card configured to supply test current signals to the integrated circuit package; and
- a digital multimeter (DMM) card configured to supply test voltage signals to the integrated circuit package, wherein the data acquisition system is coupled to and separate from the test board.

\* \* \* \* \*